(12) United States Patent
Furkay et al.

(10) Patent No.: US 7,005,665 B2
(45) Date of Patent: Feb. 28, 2006

(54) PHASE CHANGE MEMORY CELL ON SILICON-ON INSULATOR SUBSTRATE

(75) Inventors: Stephen S. Furkay, South Burlington, VT (US); Hendrick Hamann, Yorktown Heights, NY (US); Jeffrey B. Johnson, Essex Junction, VT (US); Chung H. Lam, Williston, VT (US); Hon-Sum P. Wong, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/708,667

(22) Filed: Mar. 18, 2004

(65) Prior Publication Data

US 2005/0208699 A1    Sep. 22, 2005

(51) Int. Cl.
*H01L 47/00*     (2006.01)
*H01L 21/00*     (2006.01)

(52) U.S. Cl. .......................... 257/2; 257/577; 257/588; 438/5; 438/102

(58) Field of Classification Search .............. 257/2–5, 257/557, 558, 577, 588, 592; 438/102, 311, 438/347, 350, 5, 103
See application file for complete search history.

(56) References Cited

U.S. PATENT DOCUMENTS

| | | | |
|---|---|---|---|
| 5,177,717 A | 1/1993 | Sato et al. | |
| 6,576,318 B1 | 6/2003 | Lee et al. | |
| 6,576,921 B1 * | 6/2003 | Lowrey | 257/42 |
| 6,586,761 B1 | 7/2003 | Lowrey | |
| 6,590,807 B1 | 7/2003 | Lowrey | |
| 6,593,176 B1 | 7/2003 | Dennison | |
| 6,597,009 B1 | 7/2003 | Wicker | |
| 6,750,469 B1 * | 6/2004 | Ichihara et al. | 257/2 |
| 2002/0144811 A1 | 10/2002 | Chou et al. | |
| 2003/0067013 A1 | 4/2003 | Ichihara et al. | |
| 2003/0123277 A1 | 7/2003 | Lowrey et al. | |
| 2003/0128568 A1 | 7/2003 | Nagle | |
| 2003/0128646 A1 | 7/2003 | Nagle | |
| 2004/0114413 A1 * | 6/2004 | Parkinson et al. | 257/2 |
| 2005/0018526 A1 * | 1/2005 | Lee | 365/232 |

* cited by examiner

*Primary Examiner*—Kevin M. Picardat
(74) *Attorney, Agent, or Firm*—Scully, Scott, Murphy & Presser; Anthony Canale

(57) ABSTRACT

The present invention includes a method for forming a phase change material memory device and the phase change memory device produced therefrom. Specifically, the phase change memory device includes a semiconductor structure including a substrate having a first doped region flanked by a set of second doped regions; a phase change material positioned on the first doped region; and a conductor positioned on the phase change material, wherein when the phase change material is a first phase the semiconductor structure operates as a bipolar junction transistor, and when the phase change material is a second phase the semiconductor structure operates as a field effect transistor.

19 Claims, 9 Drawing Sheets

PHASE CHANGE MEMORY CELL ON SILICON-ON INSULATOR SUBSTRATE

BACKGROUND OF INVENTION

1. Field of the Invention

This invention relates to semiconducting devices, and more particularly to a memory device including a phase change material that has electrical properties of a field effect transistor and/or bipolar transistor.

2. Background of the Invention

Phase change materials may exhibit at least two different states, which may be amorphous or crystalline. The amorphous state involves a more disordered crystal structure.

Transitions between these states may be selectively initiated. The phase change may be induced reversibly. Of particular interest are chalcogenide alloys, which contain one or more elements from Group VI of the Periodic Table of Elements.

Phase change materials are used in standard bulk silicon technologies to form the memory elements of nonvolatile memory devices. Each memory cell may be thought of as a variable resistor, which reversibly changes between higher and lower resistivity states corresponding with the crystalline state of the phase change material. The states may be distinguished because the amorphous state generally exhibits higher resistivity than the crystalline state. The phase change material allows for the storage of data because each phase of the phase change material may be distinguished by its' resistance.

In these devices, the phase changes of the memory element in the memory devices are accomplished by direct heating of the phase change material with high programming currents. Conventionally, bipolar transistors are used to deliver high programming currents by directly heating the phase change material. Due to the high current, direct heating of the phase change material can cause the phase change material to degrade over repeated programming operations, therefore reducing memory device performance.

A phase change memory device is needed that overcomes memory device degradation due to direct heating of the phase change material. Moreover, a phase change memory device is needed that further reduces the minimum memory cell area of a memory array layout.

SUMMARY OF INVENTION

An object of the present invention is to provide a memory structure comprising a phase change material in which the electrical properties of the structure are controlled by indirectly heating the phase change material. Another object of the present invention is to provide a phase change memory cell that comprises a hybrid metal oxide field effect transistor/bipolar transistor, where the electrical properties of the hybrid field effect/bipolar transistor are controlled by phase changes produced by indirectly heating the phase change material.

The present invention advantageously provides a memory device including a hybrid MOSFET and bipolar transistor, where the gate of the MOSFET device is replaced by a thin layer of phase change material that functions as the memory element of the memory cell. Broadly, the inventive memory device comprises:

a transistor having an emitter, a base, and a collector, the base having a lower surface adjacent an insulating layer; and a base contact comprising a phase change material.

The emitter, base, and collector regions are formed in an SOI layer of a silicon-on-insulator substrate. At least a portion of the phase change material is formed on the upper surface of the base portion of the SOI layer.

Applying high current through the transistor portion of the upper Si-containing layer (SOI layer) indirectly heats the phase change material to its melting temperature. The term "high current" is meant to denote current through the transistor on the order of about 5.0 milli-amperes per micrometer width of the transistor (mA/µm width of the transistor). Quenching the phase change material back to its solid state provides a phase change material having an amorphous state. Applying a lower current through the transistor portion of the SOI layer indirectly heats the phase change material to a lower temperature yet above the crystallization transition temperature, converting the phase change material to a crystalline state. The term "low current" is meant to denote current through the transistor on the order of about 1.0 milli-ampere per micrometer width of the transistor (mA/µm width of the transistor). The magnitudes of both programming currents stated above are relevant to semiconductor technology having a minimum feature size of about 130 nm or less, where the programming currents scale downward with smaller feature size. The change in the crystalline structure of the phase change material affects the electrical properties of the device.

The electrical properties produced by the different crystalline states of the phase change material may be configured to provide a semiconducting device that functions as either a field effect transistor (FET) or a bipolar junction transistor (BJT) depending on the crystalline state of the phase change material. Another aspect of the present invention is a semiconducting device that comprises:

a substrate comprising a first doped region flanked by a set of second doped regions;

a phase change material positioned on the first doped region; and a conductor positioned on the phase change material, wherein when the phase change material comprises a first phase the semiconductor structure operates as a bipolar junction transistor (BJT) and when the phase change material comprises a second phase the semiconductor structure operates as a field effect transistor (FET).

Specifically, the first phase of the phase change material is crystalline. The crystalline phase change material provides a low resistance/high conductivity ohmic contact between the first doped region and the conductor resulting in a device functioning similar to a bipolar junction transistor (BJT). The resistivity of the phase change material in the bipolar junction transistor (BJT) mode is less than about 10.0 milliOhm-cm (mΩ-cm). The second phase of the phase change material is amorphous. The amorphous phase change material provides a high resistance/low conductivity ohmic contact between the conductor and the first doped region, where the phase change material functions similar to the gate dielectric of a field effect transistor (FET). The resistivity of the phase change material in the field effect transistor (FET) mode is more than about 10.0 KiloOhm-cm (kΩ-cm).

Another aspect of the present invention is a method of forming the above-described phase change material memory device having a hybrid MOSFET/bipolar junction transistor. In broad terms, the method comprises the steps of:

providing a sacrificial gate atop a first conductivity region of a Si-containing layer of an SOI substrate, the sacrificial gate flanked by dielectric spacers;

forming second conductivity regions abutting the first conductivity region in the Si-containing layer;

removing the sacrificial gate to provide a gate via;

forming a phase change material liner within at least a portion of the gate via; and forming a gate conductor on the phase change material liner.

Another aspect of the present invention is a method of integrating the above-described phase change material memory structure in conjunction with logic circuitry. In broad terms, the integration comprises:

providing an initial structure comprising a memory region and a logic region formed atop a silicon-on-insulator substrate, the logic region comprising at least one gate region, the memory region comprising a plurality of sacrificial gate regions;

implanting extension region dopants into the logic region;

forming a dielectric layer atop the memory region and the logic region, where the dielectric layer is planar with a top surface of the plurality of sacrificial gates in the memory region and at least one sacrificial gate in the logic region;

providing an etch stop layer atop the logic region;

removing at least one sacrificial gate from the plurality of sacrificial gates in the memory region to provide at least one gate via, wherein the logic region is protected by the etch stop layer;

forming a phase change material liner within at least a portion of at least one gate via;

forming a gate conductor on the phase change material liner; and providing interconnect wiring to the memory region and the logic region.

DETAILED DESCRIPTION

Figure 1:
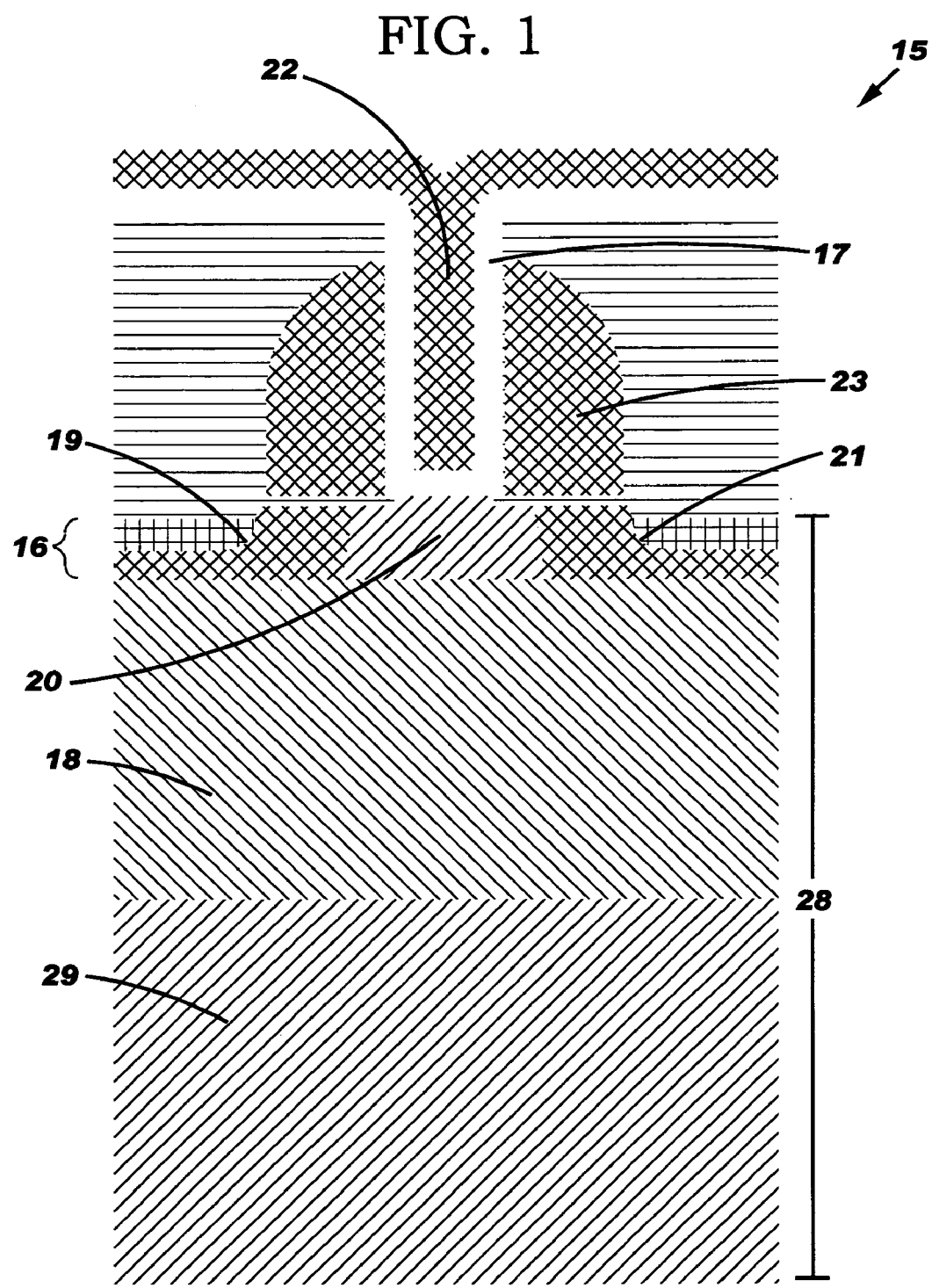
FIG. 1 illustrates (through a cross-sectional view) a semiconducting device comprising a phase change material atop a doped portion of the substrate.

The present invention provides a memory device comprising a hybrid MOSFET and bipolar transistor, where the crystalline state of a phase change material is controlled by indirect heating. The present invention is now discussed in more detail referring to the drawings that accompany the present application. In the accompanying drawings, like and or corresponding elements are referred to by like reference numbers.

Reference is first made to FIG. 1, which illustrates a phase change memory device 15 comprising a hybrid metal oxide semiconductor field effect transistor (MOSFET)/bipolar junction transistor having a phase change material 17 that functions as the gate dielectric of a MOSFET or the base contact of a bipolar junction transistor, depending on the crystalline state of the phase change material 17.

The phase change memory device 15 is formed on a sili-con-on-insulator substrate 28 including a silicon-containing upper layer 16 (hereinafter the SOI layer), insulating layer 18, and bottom bulk silicon-containing layer 29. The SOI layer 16 comprises a first type dopant region 20 flanked by a set of second type dopant regions 19, 21. When the phase change memory device is operating similar to a bipolar junction transistor, the first type dopant region 20 may be referred to as a base 20 and the set of second type dopant regions 19, 21 are commonly referred to as the emitter 19 and the collector 21. When the phase change material memory device is operating similar to a metal oxide semiconductor field effect transistor (MOSFET), the first type dopant region 20 may be referred to as a channel 20 and the set of second type dopant regions 19, 21 are commonly referred to as the source 19 and the drain 21. Hereinafter, without wishing to bound, the doped regions of the SOI layer 16 will be referred to as the emitter 19, base 20, and collector 21, despite the operating mode of the memory device.

Still referring to FIG. 1, a phase change material liner 17 is positioned between an overlying gate 22 and the base portion 20 of the SOI layer 16. The phase change material liner 17 also separates gate 22 from a set of spacers 23, where each spacer 23 is positioned flanking the gate 22. The phase change material liner 17 may comprise chalcogenide alloys. The term "chalcogenide" is used herein to denote an alloy or compound material, which contains at least one element from Group VI of the Periodic Table of Elements. Illustrative examples of chalcogenide alloys that can be employed herein include, but are not limited to, alloys of Te or Se with at least one of the elements of Ge, Sb, As, Si.

Figure 2:
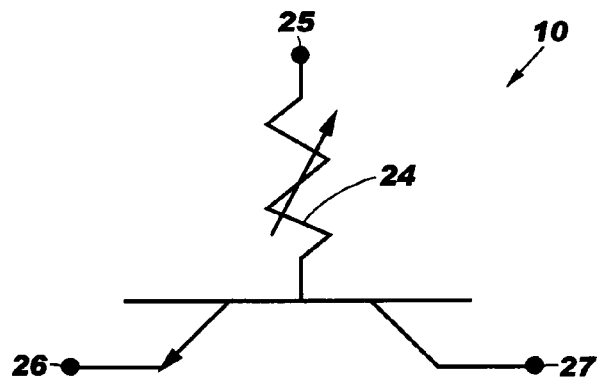
FIG. 2 depicts the equivalent circuit of the semiconducting device including a phase change material positioned between a base contact and the substrate.

Referring now to the equivalent circuit diagram of the phase change memory device 15 in bipolar junction transistor (BJT) mode depicted in FIG. 2, the phase change material liner 17 may be integrated into the hybrid MOSFET/bipolar junction transistor as a variable resistor 24. The phase change material liner 17 may be integrated as a variable resistor 24, since the resistance of the phase change material can be varied corresponding to changes in the phase change material liner's 17 crystalline structure.

Specifically, the equivalent circuit 10 of the present memory device comprises a base contact 25, emitter contact 26, and collector contact 27. The base contact 25 is the gate 22 of the device. The emitter contact 26 and collector contact 27 are the emitter and collector silicide regions. The phase change material liner 17 may function as a variable resistor 24, where electrical contact between the base contact 25 and the base 20 must extend through the variable transistor 24.

The phase change material liner 17 may have an amorphous state or a crystalline state. When in an amorphous state, the phase change material liner 17 is electrically insulating and functions similar to the gate dielectric of a metal oxide semiconductor field effect transistor (MOSFET). When in a crystalline state, the phase change material liner 17 is conductive and functions similar to the base contact of a bipolar transistor. The variation in electrical conductivity corresponding with changes in phase change material liner's 17 crystalline structure provides for the variable resistor 24 integrated within the hybrid MOSFET/bipolar junction transistor, illustrated in the equivalent circuit 10 of FIG. 2.

Figure 3:
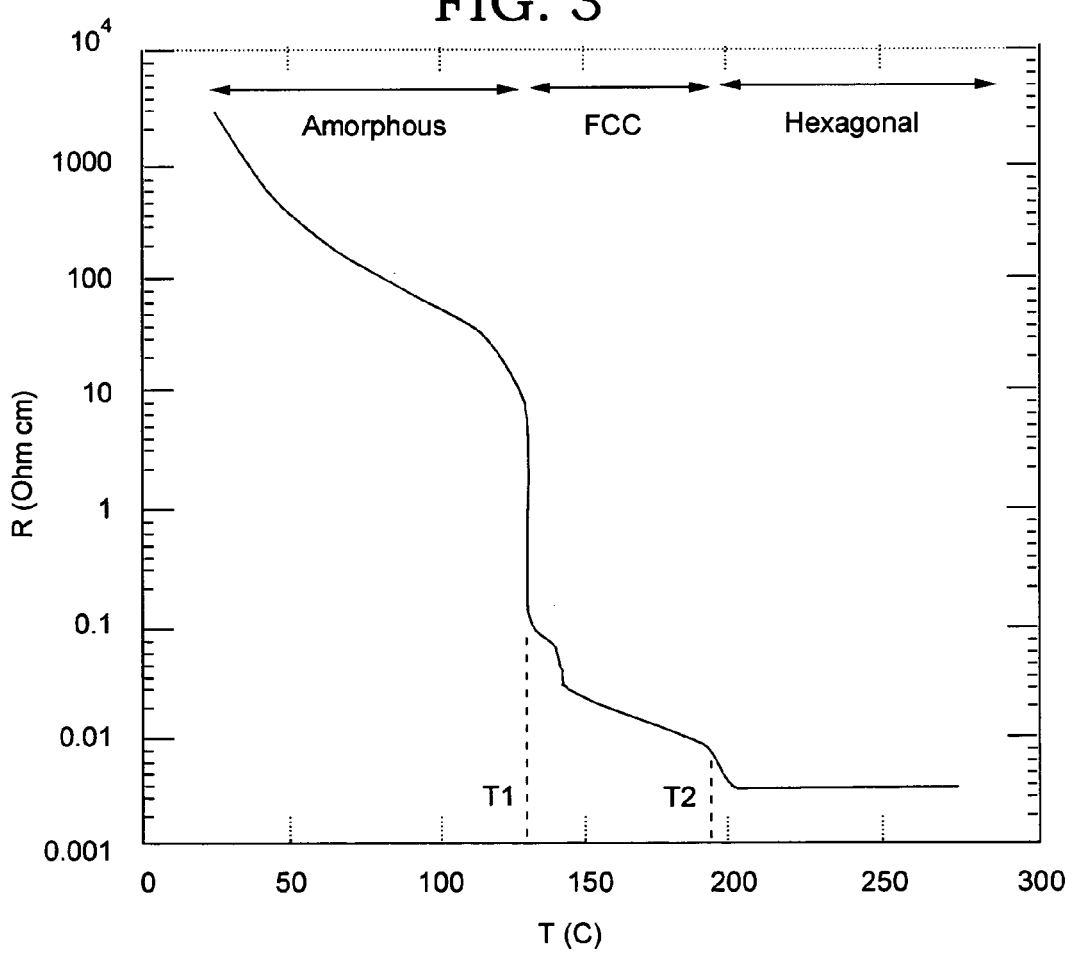
FIG. 3 illustrates a plot of resistivity [Ω-cm] vs. annealing/programming temperature [° C.] for the phase change material.

Referring to the plot depicted in FIG. 3, the relationship between the resistivity and the crystalline structure of the phase change material liner 17 is now examined. It is noted that the measurements of the $Ge_2Sb_2Te_5$ phase change material liner 17, depicted in FIG. 3, represent only one embodiment of the present invention and is given for illustrative purposes only. Therefore, the invention should not be deemed limited thereto.

The data line indicates the resistivity measurements of one embodiment of the phase change material liner 17, having composition $Ge_2Sb_2Te_5$ (GST), at temperature ranging about 25° C. to about 275° C. The starting GST material, at a temperature of about 25° C., is in the amorphous phase. As temperature increases to T1, about 125° C., the resistivity of GST drops rapidly from about 10.0 Ω-cm (ohm-cm) to about 20.0 mΩ-cm (milli-ohm-cm). Further increase in GST temperature to T2, above about 180° C., further decreases the resistivity to lower than about 2.0 mΩ-cm (milli-ohm-cm). T1 and T2 illustrate the crystallization transition temperatures of GST, where T1 represents the transition temperature for a phase change from an amorphous phase to Face Center Cubic (FCC) and T2 represents the transition temperature for a phase change from Face Centered Cubic (FCC) to Hexagonal (Hex). When the temperature of the GST is increased above the melting temperature, not shown in FIG. 3, the GST melts and upon rapid quenching the GST returns to the amorphous solid phase. For GST the melting point is about 620° C.

More specifically, referring to FIG. 3, the electrical resistivity of the amorphous $Ge_2Sb_2Te_5$ decreases from approximately $10^3$ Ω-cm to greater than approximately 2.0 mΩ-cm (milli-ohm-cm) when heated to at a temperature of approximately 150° C.; corresponding with a phase change from an amorphous state to a face centered cubic crystalline state. As exemplified by the plot depicted in FIG. 3, a phase change from a crystalline to amorphous crystal structure, results in a change of conductivity by at least a factor of 4, preferably being a factor of 6.

As indicated above, variations in temperature may reversibly convert the crystalline state of the phase change material liner 17 from an amorphous to crystalline state or from a crystalline state to an amorphous state. In contrast to conventional phase change memory devices that directly heat the phase change material, the present invention may control the crystalline state of the phase change material by indirectly heating the phase change material liner 17. Specifically, in a preferred embodiment of the present invention, phase changes may be produced by driving current through the SOI layer 16, where heat produced in the SOI layer indirectly heats the phase change material liner 17. Alternatively, the phase change material liner 17 may be directly heated.

Figure 4:
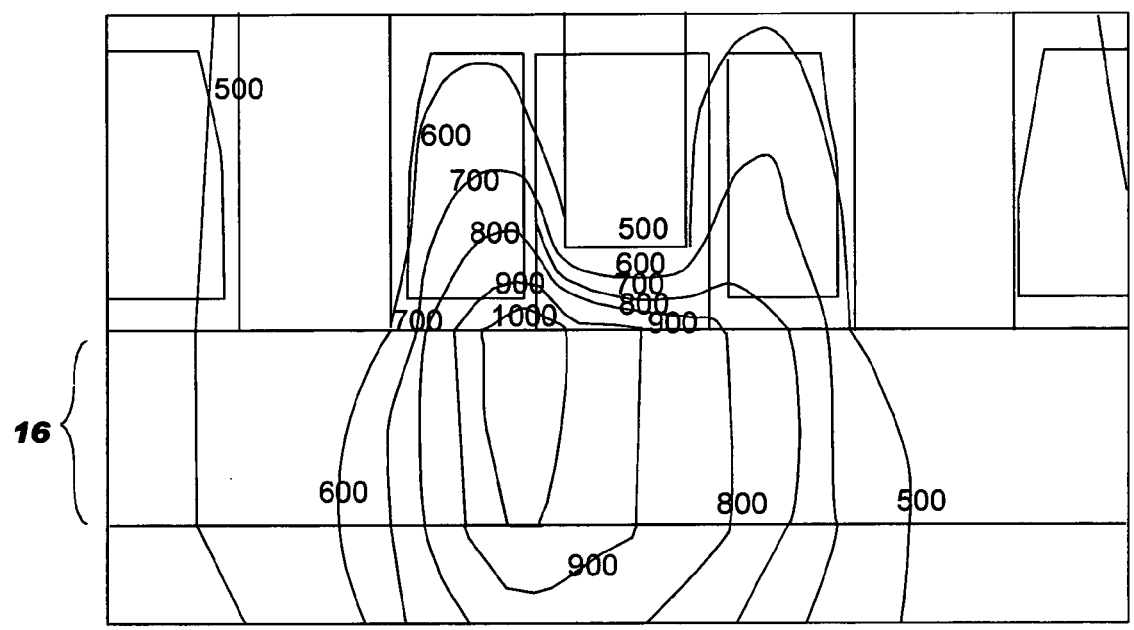
FIG. 4 depicts (through a cross-sectional view) a thermal analysis of the semiconducting device when current is applied through the SOI layer underlying the phase change material.

FIG. 4 depicts a thermal analysis of one embodiment of the memory device of the present invention incorporating a GST phase change material liner 17 in the reset mode, where resetting the phase change material memory device converts the GST material to the high resistance amorphous phase. The voltage applied to the base contact 25 is approximately 1.5 V and the voltage applied to the collector contact 27 is approximately 2.5 V. At these voltages for a time period of the 30 nanoseconds, the SOI layer 16 is heated to a peak temperature of greater than approximately 700° C., where the heat radiating from the SOI layer 16 indirectly heats the phase change material from approximately 25° C. to approximately above 625° C.

The operability of a memory device incorporating a phase-change material liner 17, having electrical properties similar to those depicted in FIG. 3, are now described in greater detail. When the phase change material liner 17 is in a low resistance/high conductivity state, having an ordered crystalline crystal structure, the memory structure exhibits the electrical properties similar to a bipolar junction transistor (BJT). The gate region 22 functions like a base contact 25 providing electrical contact through the highly conductive phase change material liner 17 to the base region 20 of the SOI layer 16. The variation in resistivity of the phase change material liner 17 is greater than four (4) orders of magnitude, preferably from about 100.0 Ω-cm (ohm-cm) to about 2.0 mΩ-cm (milli-ohm-cm).

With a p-type SOI substrate and a p-type gate/base conductor, when the phase change material liner 17 is in a high resistance/low conductivity state, having an amorphous structure, the memory structure exhibits electrical properties similar to a accumulation device, such as a normally-on n-type metal oxide semiconductor field effect transistor (NMOSFET). The amorphous phase of the phase change material liner 17 is insulating having a resistivity greater than about 100.0 Ω-cm (ohm-cm). The accumulation device mode is the result of a work function difference between the gate material 22 and base portion 20 of the SOI layer 16. Therefore, the phase change material liner 17, when in an amorphous state, functions similar to the gate dielectric of a MOSFET.

Figure 5:
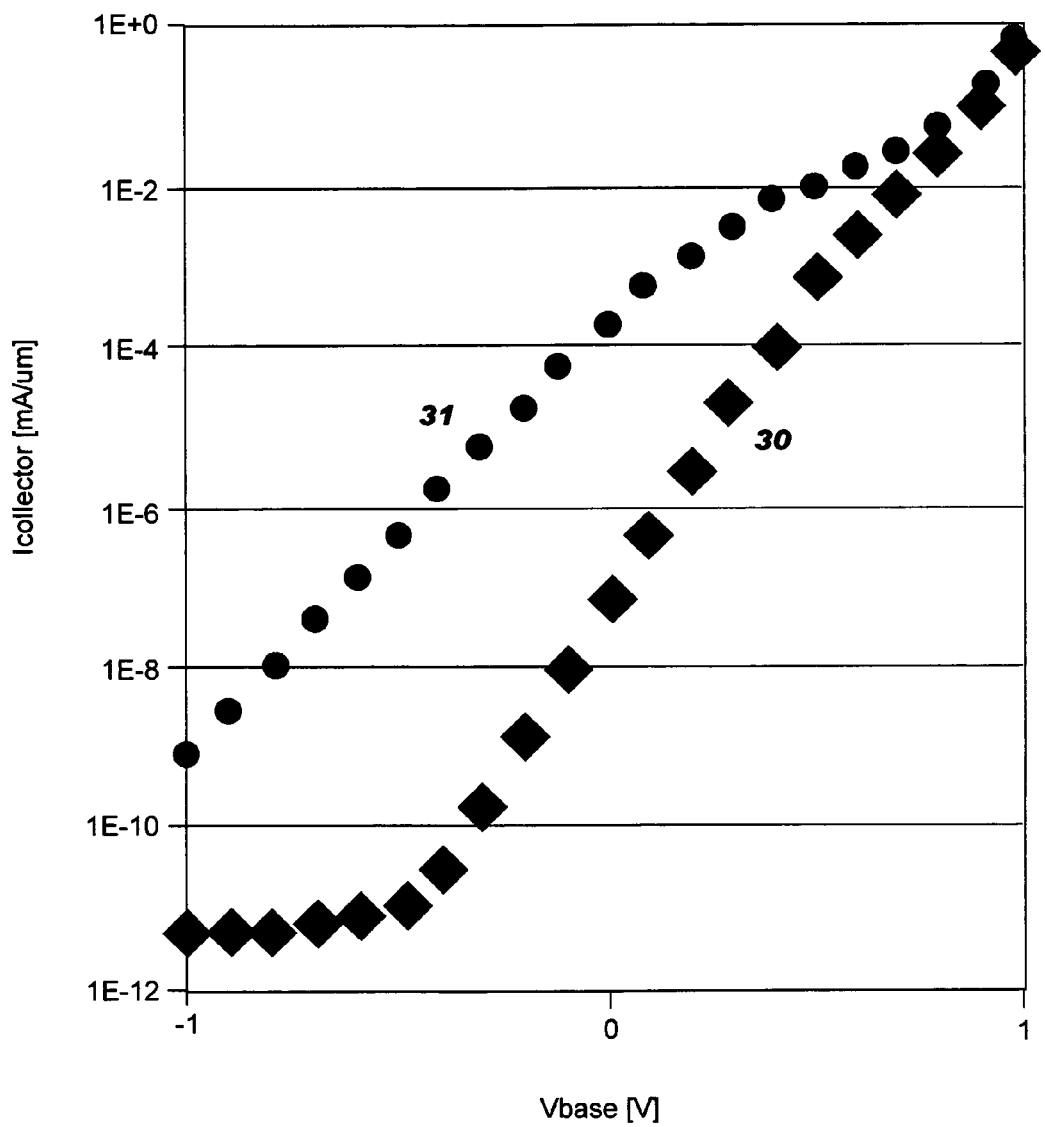
FIG. 5 illustrates a plot of current [mA/μm] measured at the collector of semiconductor devices, one having an amorphous phase change material and one having a crystalline phase change material, when a voltage is applied to the base of each device.

FIG. 5 further illustrates the electrical properties of a memory device incorporating a $Ge_2Sb_2Te_5$ phase change material liner 17. FIG. 5 depicts the current measured at the collector 21 ($I_{collector}$) of a memory device having an amorphous phase change material liner 17 and a memory device having a crystalline phase change material liner 17 as a function of the voltage applied to the base contact 25 (Vbase) of each device. It is noted that the voltages depicted in FIG. 5 are relative and that other voltages have been contemplated and are within the scope of this disclosure, so long as the relationship between the voltage and the current, which is dependent on the crystalline state of the phase change material liner 17, is maintained. It is further noted that the measurements depicted in FIG. 5 are given for illustrative purposes only; therefore, the present invention should not be limited thereto.

Referring to FIG. 5, the data plotted with diamond shaped data points 30 represents current measurements of a memory device having a crystalline phase material liner 17 between the gate 22 and the base 20 of the SOI substrate 16. The current measurements taken at the collector of a memory device having a crystalline phase liner 17 between the gate 22 and the base 20 indicate that the memory device operates similar to a bipolar junction transistor. The data plotted with circular shaped data points 31 represents current measurements of a memory device having an amorphous phase material liner 17 between the gate 22 and the base 20 of the SOI layer 16. The current measurements taken at the collector of a memory device having an amorphous phase liner 17 between the gate 22 and the base 20 indicate that the memory device operates similar to an accumulation device, such as a MOSFET.

Still referring to FIG. 5, at a voltage of approximately 1.0 V the memory device having a phase change material liner 17 in an amorphous state, illustrated using the circular data points 30, and the memory device having a phase change material liner 17 in a crystalline state, illustrated using the diamond data points 30, both have an $I_{collector}$ measurement of $10^{-9}$ mA/μm or less. At this current, both memory devices read as in the "off" state. At a voltage of +1.0 V, both the memory device having a phase change material liner 17 in an amorphous state, illustrated using the circular data points 30, and the memory device having a phase change material liner 17 in a crystalline state, illustrated using the diamond data points 30, both have an $I_{collector}$ measurement on the order of 1.0 mA/μm. At this current, both memory devices read as in the "on" state.

At a voltage of 0.0 V, the on/off state of the memory devices having an amorphous phase change material liner 17 or crystalline phase change material liner 17 differ. At a voltage of 0.0 V, the $I_{collector}$ measurement 31 of the memory device having an amorphous phase change material liner 17 is on the order of approximately $10^{-4}$ mA/μm, where the memory device may be programmed to be read as in the "on" state. At a voltage of 0.0 V, the $I_{collector}$ measurement 30 of the memory device having an crystalline phase change material liner 17 is approaching $10^{-8}$ mA/μm, where the memory device may be programmed to be read as in the "off" state.

Still referring to FIG. 5, the memory device incorporating the crystalline state of the phase change material liner 17 provides a device having electrical properties similar to a bipolar junction transistor, where the device remains in the "off state" at lower voltages when compared to a similar memory device incorporating an amorphous phase change material liner 17, having electrical properties similar to a MOSFET. The amorphous phase change material liner 17 memory device is in the "on state" at lower voltages than the memory device having a crystalline phase change material liner 17 partially due to the work function difference between the gate 22 and the underlying SOI layer 16, where the phase change material liner 17 functions similar to the gate dielectric of a MOSFET.

In a preferred embodiment, when a p+ polysilicon or tungsten gate 22 is positioned on an amorphous phase change material liner 17, which is positioned on a p-type silicon base 20, the memory device is normally "on" and when no voltage is applied to the gate 22 the memory device will conduct due to the work function difference between the gate 22 and the base 20. However, when the phase change material 17 is in the crystalline state the gate 22 is in direct electrical contact with the base through a very low resistance/high conductivity resistor; therefore, providing good control of the base regardless of the difference in work function between the base 20 and the gate 22.

The following operations may be conducted using a phase change material memory device 15 having similar electrical properties to the electrical properties of the device depicted in FIG. 5. It is noted that the following operations represent only one embodiment of the present invention and that the present invention should not be limited thereto. The following operations are given for illustrative purposes only.

A reset operation, in which the memory device writes "0", may be provided by applying a voltage on the order of 1.5 volts to the base contact 25, 2.5 volts to the collector contact 27, and 0.0 volts to the emitter contact 26, for approximately 20 nanoseconds. During the reset operation, the phase change material liner 17 is indirectly heated to a high temperature, on the order of about 650° C., and quenched to provide an amorphous crystal structure.

A set operation, where the memory device writes "1", may be provided when applying a voltage on the order of 1.0 volt to the base contact 25, 2.5 volts to the collector contact 27, and 0.0 volts to the emitter contact 26. During the set operation, the phase change material liner 17 is indirectly heated slowly raising the temperature of the phase change material liner 17 to a temperature ranging from about 300° C. to about 400° C., providing a crystalline structure.

A read operation may be provided by applying 0.0 volts to the base contact 25, 0.5 volts to the collector contact 27, and 0.0 volts to the emitter contact 26. The crystalline structure of the phase change material liner 17 is not affected by the read operation.

The method of integrating the memory device depicted in FIG. 1 in a memory logic array is now described in FIGS. 6–15. In a preferred embodiment, the logic region 35 may comprise at least one NMOSFET and the memory region 40 comprises at least one hybrid NMOSFET/PNP bipolar transistor. The logic region 35 may further comprise PMOSFET devices. Alternatively, the logic region 35 may comprise at least one PMOSFET and the memory region 40 comprises at least one hybrid PMOSFET/NPN bipolar transistor.

Figure 6:
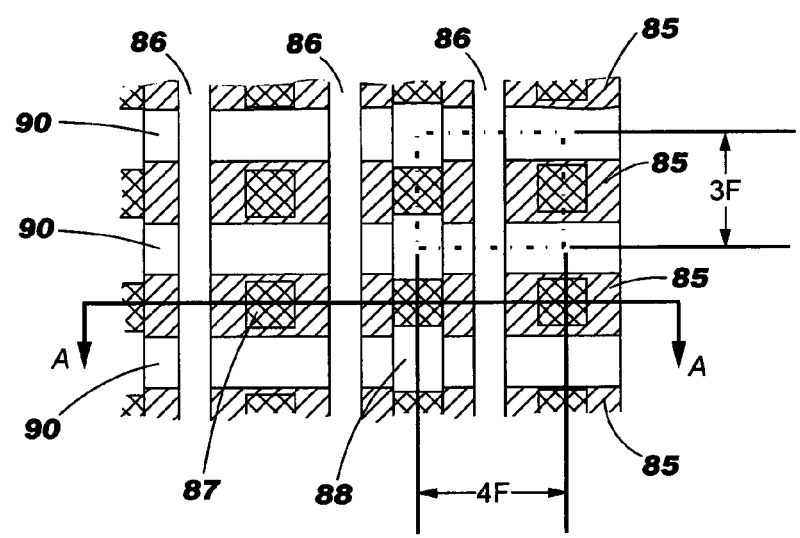
FIG. 6 illustrates a memory/array layout, incorporating semiconducting devices having the phase change material.

Referring first to FIG. 6, a memory array layout is depicted (top-down view) having a feature size of about 4.0 in one direction 4F, i.e., x-direction, and having a feature size of about 3.0 in a second direction 3F, i.e., y-direction. Each memory array region is separated from the adjacent memory array region by an isolation region. The active SOI areas (Rx) 85 are separated from one another by the regions outside of active SOI areas (Rx), which are shallow trench isolation areas 90. The gate areas (PC) over the substrate are denoted by reference number 86. The collector and base contact (CA) area are denoted by the square regions 87. The emitter/source is common to all memory cells in each column and is electrically connected by metal layer (M1) 88.

Figure 7:
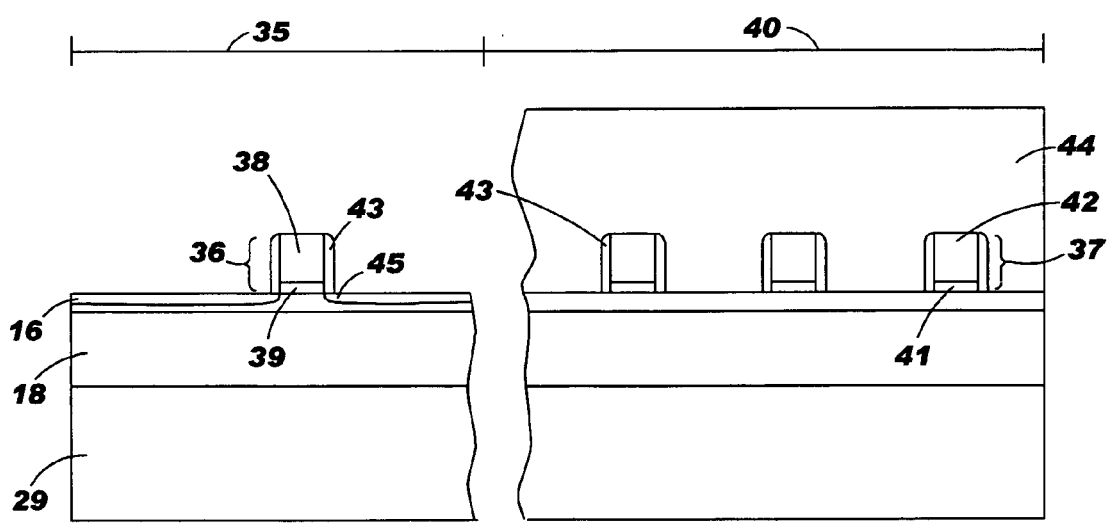
FIGS. 7–15 illustrates (through a cross-sectional view) a method of forming a semiconducting device having a phase change material integrated within the memory region of a memory/logic device.

Referring now to FIG. 7, an initial structure is provided having a logic region 35 and a memory region 40 formed on a silicon-on-insulator substrate 28 having an SOI layer 16 atop a buried insulating layer 18. The logic region 35 includes at least one gate region 36 and the memory region 40 includes a plurality of sacrificial gate regions 37.

The silicon-on-insulator substrate 28 is fabricated using techniques well known to those skilled in the art. For example, the silicon-on-insulator substrate 28 may be formed by a thermal bonding process, or layer transfer, or alternatively, the silicon-on-insulator structure may be formed by an oxygen implantation process, which is referred to in the art as a separation by implantation of oxygen (SIMOX).

The SOI layer 16 may be a Si-containing layer having a thickness ranging from approximately 20 nm to approximately 70 nm. The term "Si-containing layer" as used herein denotes any semiconductor material that includes silicon. Illustrative examples of various Si semiconductor materials that can be employed in the present invention include, but are not limited to: Si, SiGe, SiGeC, SiC and other like Si-containing materials. Combinations of the aforementioned semiconductor materials can also be used as the Si-containing layers of the silicon-on-insulator substrate 28. The buried insulating layer 18 is typically a buried oxide region, which may have a thickness ranging from about 150 nm to about 200 nm. The thickness of the bulk Si layer 29, underlying the buried insulating layer 18 in not pertinent to the present invention.

The gate regions 36, 37 in the logic portion 35 and the memory array 40 are then formed on the SOI layer 16. The gate regions 36, 37 are formed using conventional photolithography and etching. The gate regions 36, 37 comprise at least a gate electrode 38, 42 atop a gate dielectric 39, 41. First, the gate dielectric material 39, 41 is formed followed by the gate electrode material 38, 42. The gate regions 36, 37 are then patterned by photolithography and etching. The gate electrodes 38, 42 are preferably polysilicon but may also be comprised of other conductors including, but not limited to: elemental metals, metal alloys, or metal silicides.

The gate dielectric 39, 41 may be conventional dielectric materials such as $SiO_2$ or $Si_3N_4$, or alternatively high-k di-electrics such as oxides of Ta, Zr, Al or combinations thereof. Typically, the gate dielectric 39, 41 material has a thickness from about 1 nm to about 10 nm. The gate di-electrics 39, 41 preferably comprise $SiO_2$ having a thickness from about 1 nm to about 2.5 nm.

Following the formation of the gate regions 36, 37, a set of first spacers 43 are formed abutting the gate regions 36, 37. The first spacers 43 are formed using conventional deposition and etch processes well known within the art. The first spacer 43 material may comprise a di-electric such as a nitride, oxide, oxynitride, or a combination thereof. The first spacers 43 may have a thickness ranging from about 6 nm to about 12 nm. Preferably, the first spacer 43 is an oxide material.

In a next process step, a memory block mask 44 is positioned on the memory region 40 of the device using conventional photoresist application and patterning. More specifically, a layer of photoresist is deposited atop the entire structure. The photoresist layer is then selectively patterned and developed to form a block mask 44, protecting the memory region 40 of the substrate, while exposing the logic region 35.

The exposed logic region 35 is then processed to form extension regions 45, while the memory region underlying the block mask 44 is protected. Extension regions 45 are formed using a conventional ion implantation process. Preferably, the logic regions 35 are processed to form at least one NMOSFET (n-type channel MOSFET), where the extension regions 45 of the device are implanted with p-type implants. P-type extension regions 45 are typically produced with group III elements. In the case of the p-type implants, a typical impurity species is boron or $BF_2$. Boron with an energy of about 0.2 keV to about 3.0 keV or $BF_2$ with an energy of about 1.0 keV to about 15.0 keV and a dose of about $5\times10^{13}$ atoms/cm$^2$ to about $3\times10^{16}$ atoms/cm$^2$ can be used to implant the p-type region.

Alternatively, the logic region 35 of the device may include at least one PMOSFET (p-type channel MOSFET), where the extension regions of the PMOSFET are implanted with n-type implants. N-type implants are typically group V elements; preferably the n-type implant is arsenic. The n-type regions can be implanted with arsenic using an energy of about 0.25 keV to 5.0 keV with a dose of about $3\times10^{13}$ atoms/cm$^2$ to about $3\times10^{16}$ atoms/cm$^2$.

In another embodiment of the present invention, the logic region 35 of the device may include both NMOSFETS and PMOSFETS, where the extension regions 45 of the device are selectively processed using source/drain implant block masks (not shown) and the memory region 40 of the device is protected by the memory region block mask 44.

Figure 8:
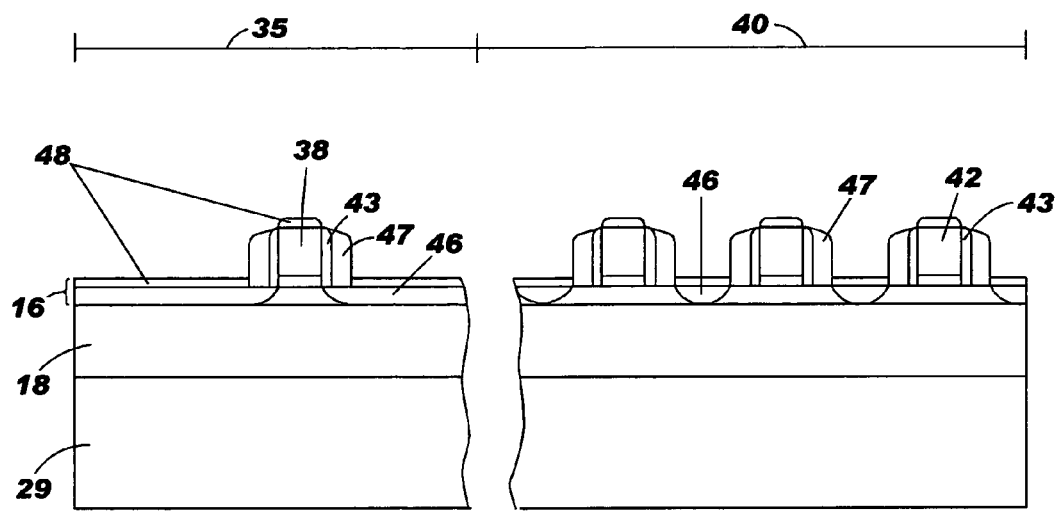

Referring to FIG. 8, following extension region 45 formation, the memory block mask 44 is stripped using a chemical strip. In a next process step, a second set of spacers 47 are formed abutting the first set of spacers 43 in the logic region 35 and the memory region 40 of the substrate.

Source and drain regions 46 are then implanted in both the logic region 35 and the memory region 40 of the device using conventional implantation process steps, in which n-type and p-type regions are selectively processed using source/drain block masks (not shown). Preferably, the source and drain regions 46 of the memory devices in the memory region 40 and NMOSFETS in the logic region 35 are simultaneously implanted with p-type dopants.

The source and drain regions 46 formed in the memory region 40 may also be referred to as the emitter and the collector.

Typical implant species for the p-type region maybe boron or $BF_2$. The p-type source/drain region 46 can be implanted with boron utilizing an energy of about 1.0 keV to 8.0 keV with a dose of about $1\times10^{15}$ atoms/cm$^2$ to about $7\times10^{15}$ atoms/cm$^2$. The p-type source/drain regions 46 may also be implanted with $BF_2$ with an implant energy of about 5.0 keV to about 40.0 keV and a dose of about $1\times10^{15}$ atoms/cm$^2$ to about $7\times10^{15}$ atoms/cm$^2$.

The n-type source/drain region 46 implants may be phosphorus or arsenic. N-type source/drain regions 46 may be implanted with phosphorus using an energy of about 3.0 keV to about 15.0 keV with a dose of about $1\times10^{15}$ atoms/cm$^2$ to about $7\times10^{15}$ atoms/cm$^2$. N-type source/drain regions 46 may be implanted with arsenic using an energy of about 6.0 keV to 30.0 keV with a dose of about $1\times10^{15}$ atoms/cm$^2$ to about $7\times10^{15}$ atoms/cm$^2$.

Still referring to FIG. 8, silicide regions 48 are then formed atop the source/drain extension regions 45, source/drain regions 46 and gate regions 36, 37. Silicide formation typically requires depositing a silicide metal such as Ni, Co, W, Pt or Ti (and alloys thereof) onto the exposed surfaces of a silicon-containing surface. A pre-clean may be performed prior to metal deposition to remove residual oxide and other contamination from surfaces on which the silicide regions 48 are formed using a wet cleaning process. Following metal deposition, the structure is then subjected to an annealing step using conventional processes such as, but not limited to, rapid thermal annealing. During thermal annealing, the deposited metal reacts with Si forming a metal silicide.

Figure 9:
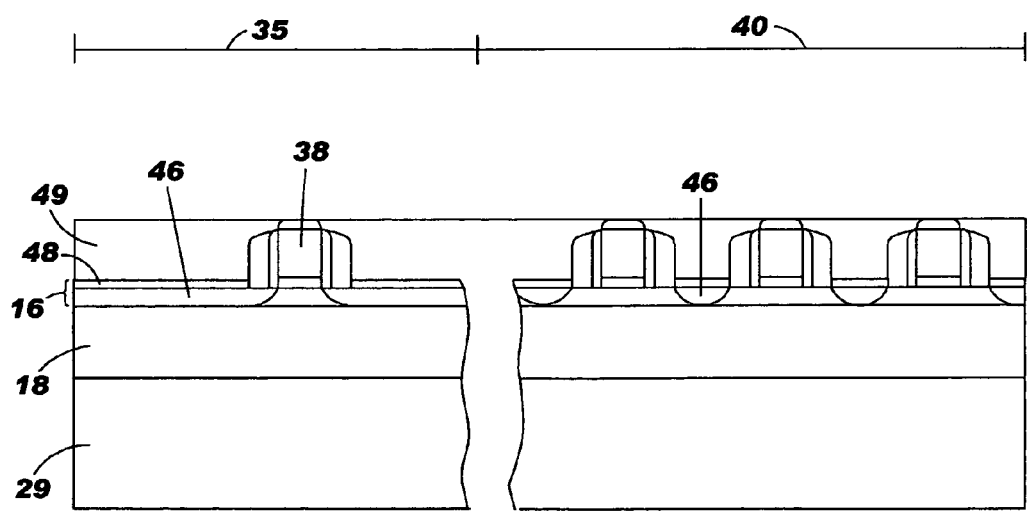

Turning to FIG. 9, a dielectric layer 49, i.e., $SiO_2$, is deposited from a tetra-ethyl orthosilicate (TEOS) precursor. Preferably, the dielectric layer 49 is deposited using plasma enhanced TEOS or plasma enhanced CVD at a temperature of less than about 600° C., preferably at about 400° C. The dielectric layer 49 is then planarized using conventional planarization techniques, such as chemical mechanical planarization (CMP), until the upper surfaces of the silicide contacts 48 atop the gate regions 36, 37 in the logic region 35 and the memory region 40 are ex-posed.

Figure 10:
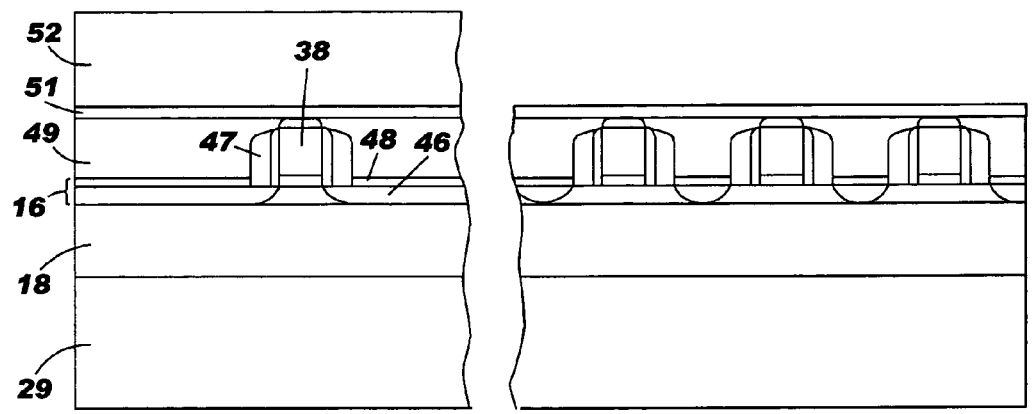

Referring to FIG. 10, a dielectric film 51 is then deposited atop the entire structure, including the logic region 35 and the memory region 40. The dielectric film 51 may be a nitride or oxynitride material. In a preferred embodiment, the nitride layer 51 comprises $Si_3N_4$ and has a thickness on the order of approximately 10 nm. A logic region block mask 52 is then formed atop the logic region 35, where the memory region 40 is exposed. The dielectric film 51 is then etched from the memory region 40, while the portion of the dielectric film 51 underlying the logic region block mask 52 is protected. The dielectric film 51 is etched using an isotropic low energy etch. Preferably, the etch chemistry is selective to the underlying dielectric layer 49 and may comprise $CF_3$ and/or $CF_4$.

Figure 11:
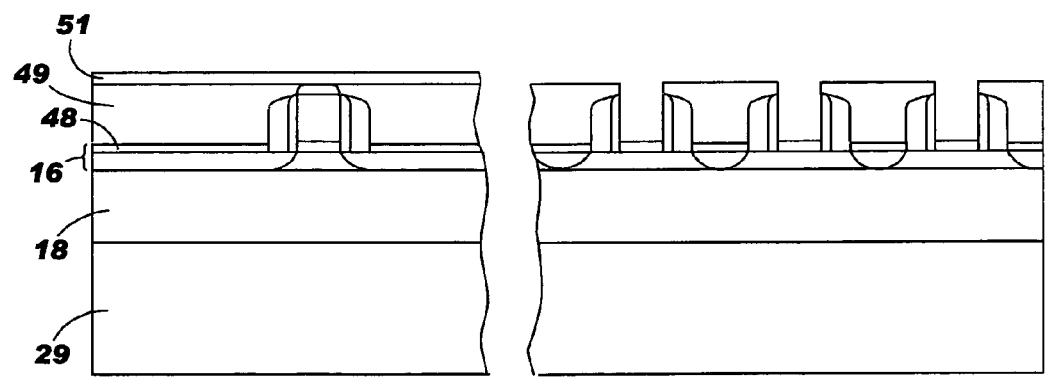

Referring now to FIG. 11, following dielectric film 51 etch the logic region block mask 52 is then removed using a chemical strip. In a next process step, the exposed silicide regions 48 atop the gate regions 36 of the memory array 40 are removed by a conventional etch process, such as reactive ion etch, where the logic region 35 is protected by a remaining portion of the dielectric film 51. Preferably, the silicide etch chemistry removes silicide selective to the TEOS oxide of the dielectric layer 49 and the silicon nitride ($Si_3N_4$) of the dielectric film 51. Most preferably, the silicide etch chemistry comprises fluorine-containing species, such as HF.

Following silicide etch, the sacrificial gate regions 37 are removed from the memory region 40 using a conventional etch process, such as reactive ion etch. Preferably, the sacrificial gate etch selectively removes the polysilicon sacrificial gate regions 37 without etching the TEOS oxide of the dielectric layer 49 and the silicon nitride ($Si_3N_4$) of the dielectric film 51. Most preferably, the sacrificial gate etch comprises potassium hydroxide (KOH) etch chemistries, where the etch process terminates on the gate dielectric 41.

The gate dielectric 41 is then removed from the gate regions 37 within the memory region 40 of the device using a selective etch process that does not substantially etch the underlying SOI layer 16. Preferably, the gate dielectric etch selectively removes the silicon dioxide ($SiO_2$) of the gate dielectric 41 without etching the TEOS oxide of the dielectric layer 49 and the silicon nitride ($Si_3N_4$) of the dielectric film 51.

In one embodiment, the oxide of the gate dielectric may be removed by a chemical oxide removal (COR) process that is carried out at relatively low pressures (6 milli-torr or less) in a vapor of HF and $NH_3$ and removes a portion of the oxide gate dielectric without damaging the underlying SOI layer 16. Alternatively, the gate dielectric 41 may be removed using dry etch processes, including but not limited to: reactive ion etch and high-density plasma etch. In order to ensure that the gate dielectric 41 is removed without damaging the underlying SOI layer 16, the etch process may be timed or monitored using end point detection methods. The portion of the SOI layer 16 exposed following the removal of the gate dielectric 49 is then wet cleaned with a chemical mixture of $NH_4OH/H_2O_2/H_2O$ or $HCl/H_2O_2/H_2O$.

Figure 12:
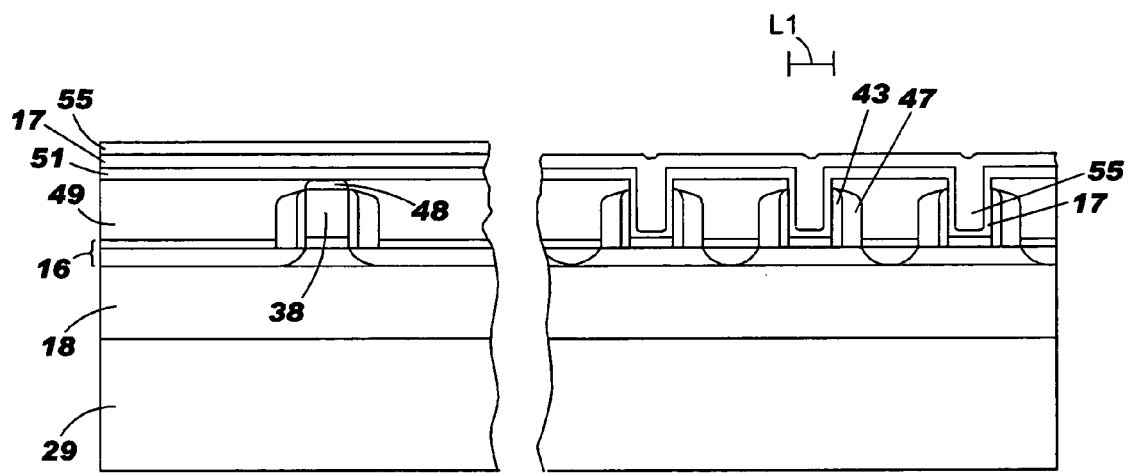

A phase change material liner 17 is then deposited atop the logic region 35 and the memory region 40, as depicted in FIG. 12. The phase change material liner 17 may be deposited using low temperature deposition processes, at temperatures less than 600° C., including, but not limited to: sputtering and chemical vapor deposition (CVD). The phase change material liner 17 may comprise chalcogenide alloys. Chalcogenide alloys include alloys containing elements from Group VI of the Periodic Table of Elements including, but not limited to: sulfur (S), selenium (Se), and tellurium (Te). The phase change material liner 17 may also comprise germanium (Ge) and antimony (Sb). In one embodiment, the phase change material 17 comprises $Ge_xSb_yTe_z$, most preferably $Ge_2Sb_2Te_5$ (GST). Additionally, the phase change material liner 17 may comprise a thickness ranging from approximately 10 nm to approximately 30 nm, preferably being 20 nm.

Still referring to FIG. 12, a polysilicon layer 55 is then deposited atop the phase change material liner 17 by low temperature forming methods. Low temperature forming methods include any method of forming the polysilicon layer 55 at temperatures less than 600° C., including, but not limited to: plasma enhanced chemical vapor deposition. The thickness of the polysilicon layer 55 as deposited may range from about 450 nm to about 650 nm, preferably being about 50 nm for a 90 nm gate length L1.

The polysilicon layer 55 is then doped to provide a conductive material suitable for a gate conductor 22. The dopant may be introduced by ion implantation or a doped the polysilicon layer 55 may be doped in situ. When forming the preferred hybrid NMOSFET/PNP bipolar transistor, the polysilicon layer 55 is implanted with group III elements, i.e., boron, to produce p-type polysilicon layer 55. A typical implant dose for boron ranges from about $1\times10^{15}$ atoms/$cm^2$ to about $5\times10^{15}$ atoms/$cm^2$ at an implant energy of about 4.0 keV to about 10.0 keV.

Alternatively, when forming a hybrid PMOSFET/NPN bipolar transistor, the polysilicon layer 55 is implanted with group V elements, i.e., arsenic or phosphorus, to produce n-type polysilicon layer 55. A typical polysilicon layer 55 implant dose for arsenic ranges from about $1\times10^{15}$ atoms/$cm^2$ to about $5\times10^{15}$ atoms/$cm^2$ at an implant energy ranging from about 10.0 keV to about 30.0 keV. A typical implant dose for phosphorus ranges from about $1\times10^{15}$ atoms/$cm^2$ to about $5\times10^{15}$ atoms/$cm^2$ at an implant energy ranging from about 5.0 keV to about 20.0 keV.

The top surface of the structure depicted in FIG. 12 is then planarized by conventional methods, such as chemical mechanical planarization (CMP), to remove the phase change material liner 17 and polysilicon layer 55 from the logic region stopping on the dielectric layer 51.

Figure 13:
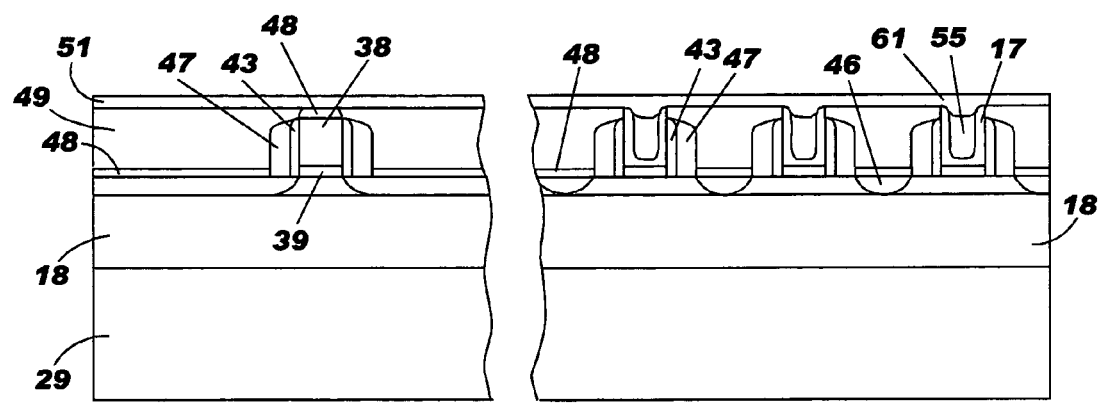

Referring to FIG. 13, a layer of metal silicide 61 is then formed atop the memory region 40. First, a layer of low temperature metal is deposited atop the logic and memory regions 35, 40. Low temperature metals include metals that may be deposited at temperatures less than about 600° C., such as Ni. Preferably, the layer of low temperature metal may be deposited by sputter deposition. The layer of low temperature metal may then be annealed to convert the low temperature metal layer to metal silicide layer 61. During annealing, the deposited metal reacts with Si forming a metal silicide.

Figure 14:
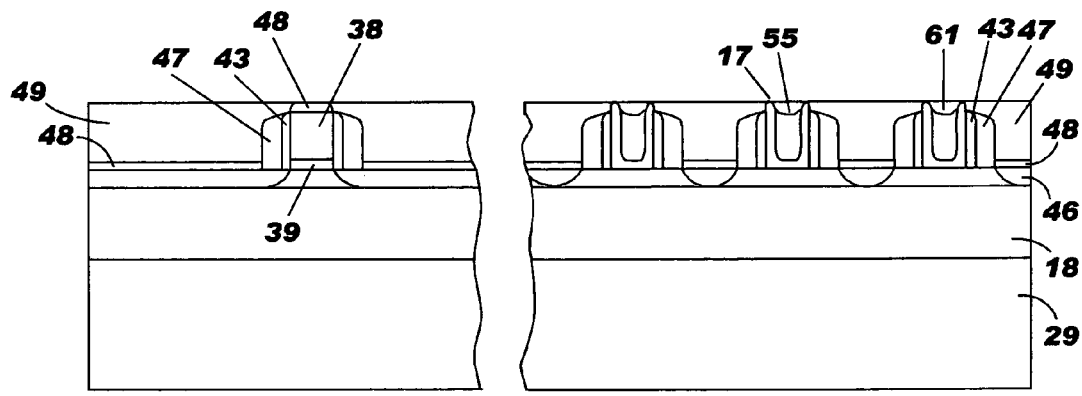

Optionally, the layer of metal silicide 61 and remaining portion of the dielectric film 51 may be removed from the logic region 35 by conventional planarization or etch processes, terminating on the dielectric layer 49, as depicted in FIG. 14. In one embodiment, the dielectric film 51 remains.

Figure 15:
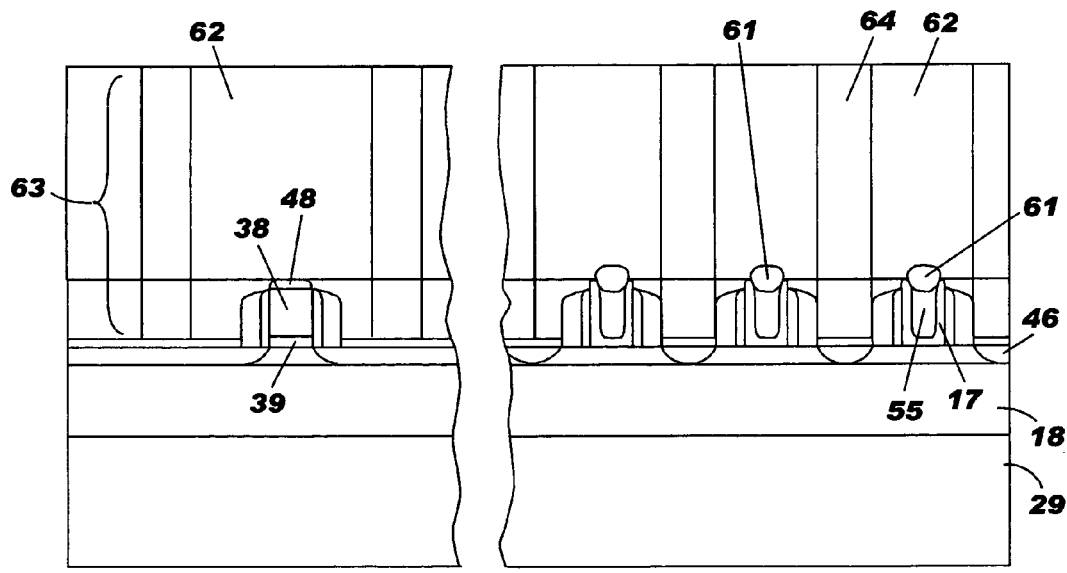

Referring to FIG. 15, in a next process step an upper dielectric layer 62 is blanket deposited atop the entire substrate and planarized. The upper dielectric layer 62 may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α—C:H). Additional choices for the upper dielectric 62 include: any of the aforementioned materials in porous form, or in a form that changes during processing to or from being porous and/or permeable to being non-porous and/or non-permeable.

The upper dielectric 62 may be formed by various methods well known to those skilled in the art, including, but not limited to: spinning from solution, spraying from solution, chemical vapor deposition (CVD), plasma enhanced CVD (PECVD), sputter deposition, reactive sputter deposition, ion-beam deposition, and evaporation.

The upper dielectric 62 is then patterned and etched to form via holes 63 to the various source/drain and gate conductor regions of the substrate. Following via 63 formation interconnects 64 are formed by depositing a conductive metal into the via holes 63 using conventional processing, such as sputtering or plating. The conductive metal may include, but is not limited to: tungsten, copper, aluminum, silver, gold, and alloys thereof.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A memory structure comprising:
    a transistor having an emitter, a base, and a collector, said base having a lower surface adjacent an insulating layer; and
    a base contact comprising a phase change material liner, wherein a portion of said phase change material liner is located directly on a surface of said base.

2. The memory structure of claim 1, wherein said transistor induces phase changes in said phase change material liner.

3. The memory structure of claim 1, wherein said phase change material liner comprises a chalcogenide alloy.

4. The memory structure of claim 3, wherein said chalcogenide alloy comprises $Ge_2Sb_2Te_5$.

5. The memory structure of claim 1, wherein said emitter is n-type, said base is p-type, said collector is n-type and said base contact further includes a region of p-type polysilicon.

6. The memory structure of claim 1, wherein said emitter is p-type, said base is n-type, said collector is p-type and said base contact further comprises a region of n-type polysilicon.

7. The memory structure of claim 1, wherein said insulating layer comprises a buried oxide (BOX) layer of a silicon-on-insulator substrate.

8. A semiconductor structure comprising:
    a substrate comprising a first doped region flanked by a set of second doped regions;
    a phase change material positioned on said first doped region; and
    a conductor positioned on said phase change material, wherein when said phase change material comprises a first phase said semiconductor structure operates as a bipolar junction transistor, and when said phase change material comprises a second phase said semiconductor structure operates as a field effect transistor.

9. The semiconductor structure of claim 8, wherein said phase change material comprises a chalcogenide alloy.

10. The semiconductor structure of claim 9, wherein said chalcogenide alloy comprises $Ge_2Sb_2Te_2$.

11. The semiconductor structure of claim 8, wherein said first phase comprises a crystalline solid phase.

12. The semiconductor structure of claim 8, wherein said second phase comprises an amorphous solid phase.

13. The semiconductor structure of claim 8, wherein said phase change material is converted to said first phase or said second phase by heat radiating from said substrate.

14. A method of forming a memory device comprising:
    providing an initial structure comprising a sacrificial gate atop a first conductivity region in a Si-containing layer of an SOI substrate, said sacrificial gate flanked by a set of spacers;
    forming second conductivity, regions abutting said first conductivity region in said Si-containing layer;
    removing said sacrificial gate to provide a gate via;
    forming a phase change material liner within at least a portion of said gate via; and
    forming a gate conductor on said phase change material line.

15. The method of claim 14, wherein said phase change material liner comprises a chalcogenide alloy.

16. The method of claim 14, wherein said phase change material liner has a thickness of less than about 20 nm.

17. The method of claim 14 wherein said sacrificial gate comprises polysilicon.

18. The method of claim 17 wherein said removing said sacrificial gate comprises etching said sacrificial gate with KOH.

19. The method of claim 14 wherein forming said phase change material liner comprises sputtering or chemical vapor deposition (CVD) at temperatures less than about 600° C.

* * * * *